United States Patent [19]
Brown

[11] Patent Number: 5,726,602
[45] Date of Patent: Mar. 10, 1998

[54] STABILIZED RAIL-TO-RAIL SPEAKER DRIVER CIRCUIT

[75] Inventor: David A. Brown, Indianapolis, Ind.

[73] Assignee: Lucent Technologies Inc., Murray Hill, N.J.

[21] Appl. No.: 631,396

[22] Filed: Apr. 12, 1996

[51] Int. Cl.$^6$ ............................................. H03F 3/30
[52] U.S. Cl. ............................................. 330/255; 330/267
[58] Field of Search ............................ 330/255, 267, 330/268

[56] References Cited

U.S. PATENT DOCUMENTS

| | | | |
|---|---|---|---|
| 3,451,001 | 6/1969 | Foerster | 330/255 X |
| 3,611,170 | 10/1971 | Wheatley, Jr. | 330/267 X |
| 4,232,273 | 11/1980 | Leidich | 330/255 X |

OTHER PUBLICATIONS

"Equin", Elektor, vol. 2, No. 4, pp. 448–453, Apr. 1976.
"Elektornado", Elektor, vol. 4, No. 4, pp. 4–07–11, Apr. 1978.
"50 W Audio Amplifier", Mullard Outlook, pp. 5–8, Jul. 1971.

*Primary Examiner*—James B. Mullins
*Attorney, Agent, or Firm*—Brian K. Dinicola; Joseph J. Opalach

[57] ABSTRACT

A rail-to-rail driver amplifier circuit that utilizes complementary output transistors to fully utilize the available power supply voltage. The circuit includes an input pre-amplifying circuit for receiving the audio signal and for receiving electrical energy from a power supply having a first rail at a positive potential and a second rail at a negative potential to produce a pre-amplified output signal. The circuit further includes a first output driver circuit having a voltage gain limited current amplifier coupled to the first rail and to a first output terminal of the input pre-amplifying circuit and a second output driver circuit having a voltage gain limited current amplifier coupled to the second rail and to a second output terminal of the input pre-amplifying circuit. The input pre-amplifying circuit is operable to supply the pre-amplified output signal to one of the output driver circuits when the input signal current exceeds a current threshold and to the other of the output driver circuits when the input signal current is below the current threshold. The complementary speaker driver output circuits are mirrored about the voltage appearing at a capacipacitance. This voltage will equal the value of the system signal ground which is usually midway between the positive and negative power supply rails (Vmid).

6 Claims, 4 Drawing Sheets

5,726,602

STABILIZED RAIL-TO-RAIL SPEAKER DRIVER CIRCUIT

BACKGROUND OF THE INVENTION

1. Field of The Invention

The present invention relates to audio amplification circuits and, more particularly, to speaker driven amplification circuits suitable for use in low power applications.

2. Description of The Background Art

As personal computing has become more and more common, there is substantial interest in equipping computers with the high quality audio capabilities needed for many multimedia applications. For portable computers such as notebooks, laptops, and the like, however, there is a competing design consideration that has made such capabilities difficult and uneconomical to achieve. Specifically, due to restrictions on battery weight and size, portable computers are typically provided with a low voltage power supply.

Many devices are appearing on the market that require an acoustic speaker driven output but are limited in the available voltages they can supply. The most predominant of these is the portable computer. Most portable computers run on a battery supplied 5 volt system and have this voltage available on the PS2 mouse or peripheral port. Because multimedia applications are growing in popularity, these devices need a means of supplying high fidelity audio with the power available. In the future, personal and portable hands-free communications devices will become more common. These devices will undoubtedly be battery or solar energy supplied and as their size decreases, most likely their power and voltage supply capabilities will decrease also.

Accordingly, a demand exists for a low cost, high quality speaker driver amplifier that is capable of supplying the maximum acoustic output from low voltage sources (e.g., 3 volts and above) while maintaining an acceptable level of Total Harmonic Distortion (0.5% or less).

SUMMARY OF THE INVENTION

In accordance with the present invention, a speaker driver amplifier operates to work with low supply voltages and yet meets the gain and low distortion requirements for high quality PC audio applications. The amplifier circuit is particularly suited for use in battery powered or portable communication products and solves many diverse problems found in low power applications in the related art, for example, problems of distortion, stability, and fabrication.

An input gain stage amplifies the input signal current and applies it to either of two output speaker drivers. The complimentary arrangement of output speaker drivers comprises a PNP-output voltage gain limited current amplifier and an NPN-output voltage gain limited current amplifier that are mirrored about the voltage potential that exists on a capacitor which will be referred to as "Cdrive." The quiescent DC voltage value appearing at this capacitor will be equal to the system signal ground which is a voltage that is halfway between the two supply voltages and will be referred to as "Vmid." At any given time, only one of the output amplifier is active, thereby maximizing the drive power delivered to the speaker and minimizing the DC bias current.

As the input signal current becomes less than a current threshold, an input differential amplifier causes current to flow in a Positive Speaker Driver thereby pulling the load toward the positive power rail. Conversely, when the input signal is greater than the current threshold, the input differential amplifier causes current to flow in a Negative Speaker Driver thereby pulling the load toward the negative power rail.

In accordance with an illustrative embodiment of the present invention, each voltage gain limited current amplifier comprises an input current amplifying component that is referenced to Cdrive, a single or parallel combination of drive transistors connected to one of the power supply rails, and a local feedback network that is used for stabilization. The use of plural, parallel drive transistors, the number used being selected in accordance with the drive power requirements of the load, allows power dissipation to be evenly distributed and obviates the use of heat sinks. This configuration is also highly linear and achieves Class B operation with very low total harmonic distortion. Moreover, the inventive arrangement permits the use of inexpensive, off-the-shelf components and facilitates automated device insertion during the fabrication process.

BRIEF DESCRIPTION OF THE DRAWINGS

The various features, advantages and other uses of this invention will become more apparent by referring to the detailed description which follows and to the accompanying drawings in which.

DETAILED DESCRIPTION

Figure 1:
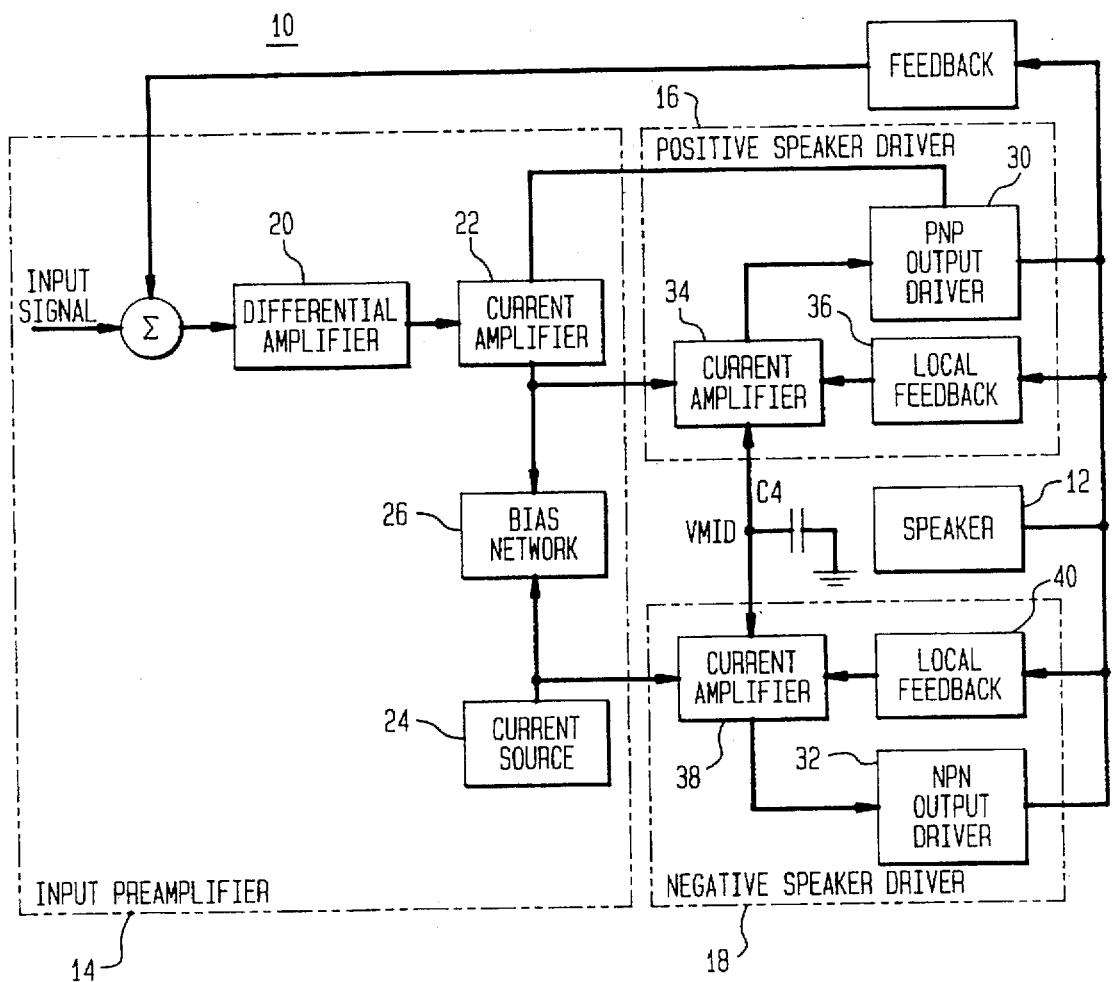
FIG. 1 is a system diagram illustrating a speaker driver configured in accordance with the present invention.

With initial reference to FIG. 1, there is shown a system diagram illustrating an embodiment of a rail-to-rail speaker driver indicated generally at 10 and constructed according to the teachings of the present invention. In the illustrative embodiment of FIG. 1, speaker driver 10 is configured for operating on a power supply of 5 volts to drive a conventional audio speaker as may be utilized to provide a laptop, notebook, or other portable computer or similar device with multimedia functionality. Essentially, speaker driver system 10 comprises an input pre-amplifying stage 14 and an output stage comprising positive and negative speaker driver sections indicated generally at 16 and 18, respectively.

Input preamplifier stage 14 amplifies the input signal current and applies it to either of the speaker drivers 16 and 18. As will be explained in more detail below, only one of the output amplifiers is active at any given time. As a result, the drive power that may be delivered to speaker 12 is maximized while the amount of DC bias current required is kept to a minimum. As seen in FIG. 1, input preamplifier stage includes a differential amplifier that is responsive to the sum of the input signal and a feedback signal to apply current to current amplifier 22. When the amplified input signal current flowing out of current amplifier 22 exceeds a fixed current threshold supplied by current source 24, the excess current flows into the current amplifier 34 of the Positive Speaker Driver 16 and, in so doing, pulls the load toward the positive power rail (V+). Similarly, when the amplified input signal current flowing out of current amplifier 22 is less than the fixed current threshold output by current 24, the value of difference current flows into the current amplifier 38 of the Negative Speaker Driver 18 thus pulling the load toward the negative power rail (V−).

With continued reference to FIG. 1, the Positive Speaker Driver 16 is comprised of a Current Amplifier 34, a PNP Output Driver 30, and the Local Feedback network 36. As will be described in more detail later, Local Feedback network 36 limits the voltage gain from input to output of the Positive Speaker Driver 16. The Negative Speaker Driver is configured in a similar manner with Current Amplifier 38, NPN Output Driver 32, and Local Feedback network 40.

Essentially, the complimentary drivers 16 and 18 are mirrored about the voltage seen at the + terminal of capacitor Cdrive which maintains a quiescent voltage of Vmid. This provides a pull-pull configuration so that the quiescent DC output voltage in the absence of input signal is equal to Vmid.

Figure 2:
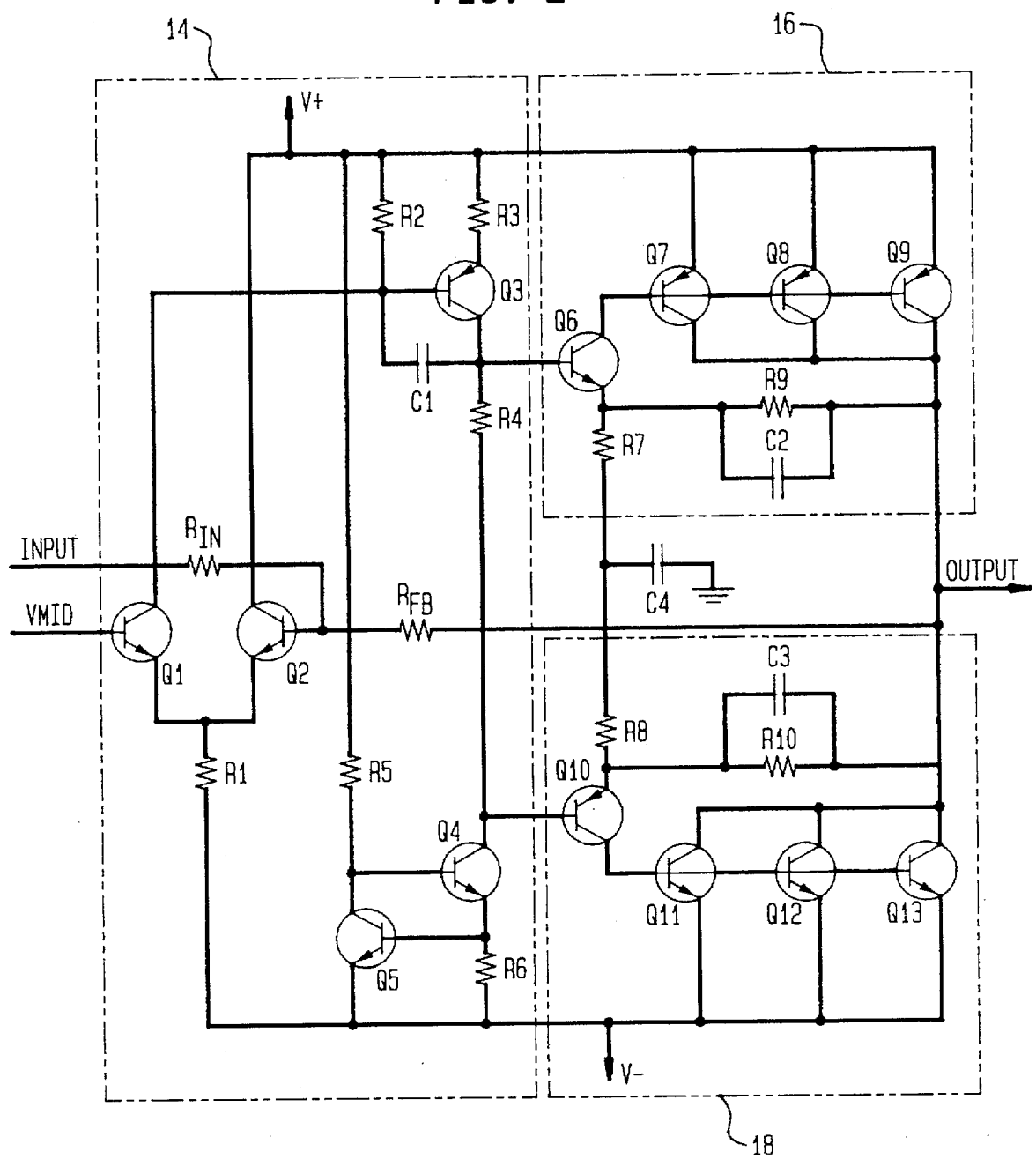
FIG. 2 is a circuit schematic depicting an exemplary circuit implementation of the speaker driver of FIG. 1.

With reference now to FIG. 2, there is shown in schematic form the speaker driver circuit 10 of FIG. 1. The values for the various devices constituting the illustrative embodiment of FIG. 2 are given below in Table I.

TABLE I

| Element | Value/Identification |
|---------|----------------------|
| Q1  | 2N3904 |
| Q2  | 2N3904 |
| Q3  | 2N3906 |
| Q4  | 2N3904 |
| Q5  | 2N3904 |
| Q6  | 2N3904 |
| Q7  | 2N2907 |
| Q8  | 2N2907 |
| Q9  | 2N2907 |
| Q10 | 2N3906 |
| Q11 | 2N2222 |
| Q12 | 2N2222 |
| Q13 | 2N2222 |
| Rin | 1KΩ |
| R1  | 1KΩ |
| R2  | 680Ω |
| R3  | 100Ω |
| R4  | 680Ω |
| R5  | 10KΩ |
| R6  | 680Ω |
| R7  | 100Ω |
| R8  | 100Ω |
| R9  | 1KΩ |
| R10 | 1KΩ |
| Rfb | 4.7KΩ |
| C1  | 220pF |
| C2  | .022μF |
| C3  | .022μF |
| C4  | 47μF |

Figure 3:
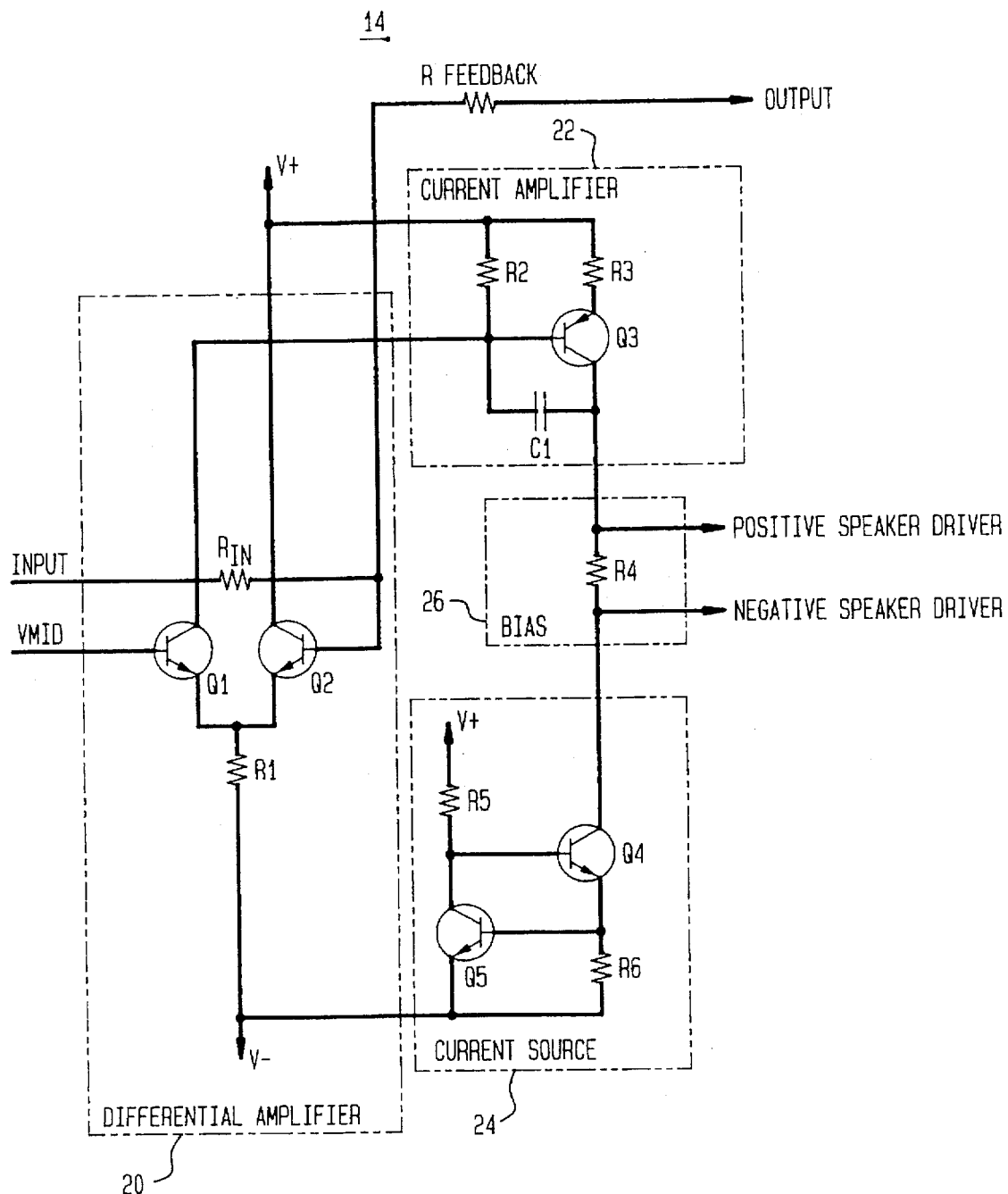
FIG. 3 is a circuit schematic depicting in greater detail the input pre-amplifier section of the exemplary driver circuit of FIG. 2.
Figure 4:
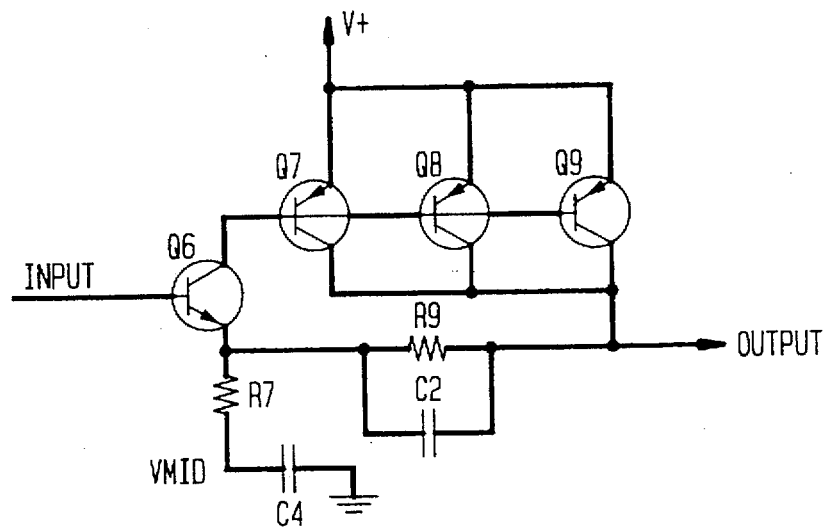
FIG. 4 is a circuit schematic depicting in greater detail the positive speaker driver section of the exemplary driver circuit of FIG. 2.
Figure 5:
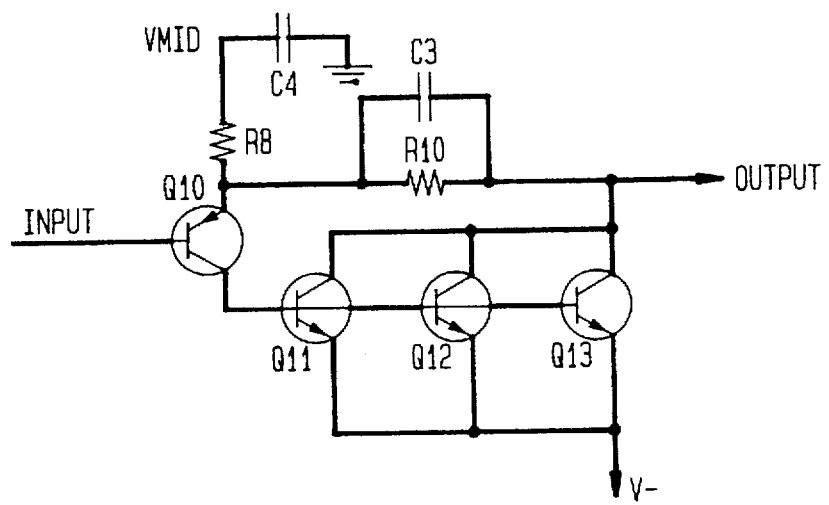
FIG. 5 is a circuit schematic depicting in greater detail the negative speaker driver section of the exemplary driver circuit of FIG. 2.

The input preamplifier section 14 and the complementary driver sections 16 and 18 depicted in FIG. 2 are also shown in FIGS. 3–5, respectively and will now be described in detail with particular reference thereto.

Turning first to FIG. 3, there is shown an enlarged view of input preamplifier section 14 with dotted line representations being used to identify the differential amplifier 20, current amplifier 22, current source 24, and bias network 26 thereof. In the illustrative embodiment depicted in FIGS. 2 and 3, differential amplifier 20 is a conventional differential wherein an AF signal input terminal is connected to a base of an npn Q2. The emitter of the transistor Q2 is connected to the emitter of a second npn transistor Q1. The connecting point between the emitters is connected to rail −V via a resistor R1 to provide a constant current source. When the base voltages are equal (in the illustrative circuit, at Vmid), then the collectors will be equal at one half of the current flowing through R1. When the base voltages are unequal, the transistor with the higher voltage will have a greater percentage of the current supplied via R1.

With continued reference to FIG. 3, it will be seen that the current amplifier 22 of input preamplifier section 12 comprises a pnp transistor Q3 that beta amplifies its base current and applies that current to bias network 26. Resistor R2 causes some of the current to bypass the base of transistor Q3 to thereby set its operating point. Specifically, the value of R2 is selected so that the Q1 collector current is equal to one-half the current flowing through R1. This arrangement results in a base voltage on transistor Q3 that produces a Q3 collector current equal to the threshold current supplied by current source 24. As will be readily apparent to those skilled in the art, when this "current equilibrium" condition is satisfied, the voltage across resistor R4 of bias network 26 is centered on Vmid.

In the illustrative embodiment of FIGS. 2 and 3, the bias network 26 comprises a simple resistance across which a voltage is developed when the collector current from transistor Q3 flows through it. The value of this voltage is preferably just under the two Vbe's needed to turn on both drivers 16 and 18, thus setting both drivers in the quiescent or "off" state during the current equilibrium condition. The illustrative current source 24 depicted in FIG. 3 is essentially supply variation independent. Resistor R5 supplies the base current to transistor Q5 while transistor Q6 is employed as a negative feedback element that keeps the voltage across resistor R6 at exactly one Vbe so as to maintain the collector current of transistor Q5 at a value of Vbe/R6. Accordingly, the use of complimentary output transistors, the peak to peak output voltage can be the entire available power supply voltage minus two transistor saturation voltages. This is the maximum achievable using any semiconductor device in the output stage.

As the collector current of transistor Q1 is varied above the equilibrium point, transistor Q3 conducts more current than current source 24 supplies and the difference current is directed into the input terminal of positive driver section 16. Conversely, when the collector current of transistor Q1 is less than the equilibrium value, transistor Q3 conducts less current than current source 24 and the difference current flows into the input terminal of negative driver section 18. In order to prevent Q6 from saturating in low voltage applications, a resistor R3 is inserted between the emitter of transistor Q3 and voltage rail V+ to limit the maximum collector voltage of Q3.

With reference now to FIGS. 4 and 5, there are shown in circuit schematic form the Positive Speaker Driver 16 and the Negative Speaker Driver 18, respectively. Positive driver section 16 includes a current amplifier comprised of Q6 and R7 biased to C4, at least one drive transistor connected to the positive power rail, and a local feedback network comprised of R9 and C2. Resistor R9 and capacitor C2 form a negative feedback network that limits the voltage gain from input to output of the driver sections 16. The value of the DC voltage gain limit is (R9/R7) and the 3 dB corner frequency of the local feedback network is determined by R9 and C2. Preferably, the impedance value of R9 is selected to reduce the system open loop voltage gain for stability reasons without limiting the amplifiers ability to achieve the output maximum voltage swing of the positive supply rail minus a transistor saturation voltage.

Negative Speaker Driver 18 is configured in a manner identical to the Positive Speaker Driver 16 and, in the arrangement depicted in FIGS. 2 and 5, includes transistor Q10 referenced to C4 (Cdrive) through R5, a single or parallel set of drive transistors (Q11 through Q13), that are connected to the negative power supply rail, and a local feedback network comprised of R10 and C3.

Each set of drive resistors can only pull the load at the output towards their respective power supply rail. The complementary arrangement of positive and negative drivers, however, generates a symmetrical output waveform on either side of Vmid. The number of parallel drive transistors Q7–Q9 and Q11–Q13 is determined by the requirements of the load and allow the power dissipated in the drive elements to be distributed amongst multiple devices. The significance of this approach is that heat sinks are entirely avoided and fabrication may be automated utilizing off-the-shelf components.

OVERALL SYSTEM OPERATION

The following description is for the system being used as an inverting speaker driver where the input signal ground is at Vmid and the speaker is either DC biased on the other side of the speaker to Vmid or AC coupled to V+, V−, or Vmid.

No Signal Condition:

In this state, the collector currents of Q1 and Q2 are equal with their bases both at Vmid. The voltage on the base of Q3 produces a Q3 collector current that is equal to the collector current of Q5. The voltages at the inputs to the positive and negative speaker drivers are an equal amount above and below Vmid and less than a Vbe. There is only leakage current flowing from the speaker driver transistors and are all relatively equal. The node at the speaker is equal to Vmid and no current flows through Rfeedback.

Signal Condition:

When signal current flows toward Q2, Q1 collector current decreases as Q2 collector current increases. This decrease, in turn, causes Q3 collector current to decrease and since Q5 collector current is constant, the difference current flows into the Negative Speaker Driver thus causing current to flow through the speaker toward V−. As a result, the speaker drive voltage drops below Vmid and current flows through feedback resistance Rfb (FIG. 2) towards the speaker. The voltage at the speaker will continue to decrease until nearly all of the input signal current flows past the base of Q2 and through Rfb. The resulting voltage at the speaker will be approximately equal to Vmid−Vin*Rfb/Rin. The same results will occur when signal current flows away from Q2 towards the source only with all the current and voltage charges being opposite in polarity.

As will be immediately ascertained by those skilled in the art, the inventive driver configuration of the present invention has several important advantages over prior art low voltage speaker driver configurations. The system is capable of achieving the maximum peak-to-peak output voltage swing of V+ minus a transistor saturation voltage to V− minus a saturation voltage. The placement of resistors R9 and R10 along with C2 and C3 provide the flexibility of reducing open loop gain and the system gain where the output phase changes 180 degrees over frequency. Therefore, unconditional stability can be achieved for any values of passive components as well as make of transistors used. Moreover, the inventive configuration does not require any transistor matching or special tolerance parts to achieve its performance specifications. The most common transistors are used throughout: 2N3904, 2N3906, 2N2222, and 2N2907. This aspect provides an advantage where timely manufacturing is important. Procuring components of this nature can require a much shorter lead time than most special function Ics. The use of common components and the elimination of heat sinks and special function speaker driver Ics also provides a circuit design which is fully auto insertable, thereby keeping the costs of fabrication very low. Finally, due to the nature of the system topology, the inventive driver circuit of the present invention can operate on supply voltages as low as 3 volts. Because of its rail-to-rail output swing, it is preferable for such low-voltage applications.

The use of voltage gain limited current amplifiers mirrored about the voltage at C4 (Vmid) facilitates different means of inputting signal to the output drivers. For instance, the point where C4 connects to the system could be the signal input point with a simple bias network at the previously discussed signal inputs to the positive and negative speaker drivers. The standard inputs could also be driven by a voltage source such as an op amp through a network of impedances that setup the bias point. Of course, as with most speaker drivers, this design can be used in a Bridge Tied Load topology where two systems are used 180 degrees out of phase with each other to drive both sides of the speaker. This has the effect of multiplying the output power by four times for the same speaker impedance.

The present invention overcomes the limitations in the related art and is particularly effective when configured and employed as described herein. However, those skilled in the art will readily recognize that numerous variations and substitutions may be made to the invention to achieve substantially the same results as achieved by the preferred embodiment. By way of illustrative example, it will be readily appreciated by those skilled in the art that because of its symmetrical topology about Vmid, the entire input preamplifier 14 may be inverted by switching positions and transistor genders of current amplifier 22 and current source 24 and by employing a PNP differential amplifier for the NPN type employed in the arrangement of FIG. 2. The detailed description should therefore be clearly understood as being given by way of illustration and example only, the spirit and scope of the present invention to be limited solely by the following claims:

What is claimed:

1. An apparatus for amplifying an audio signal having an amplitude which varies at an audio frequency comprising:

an input preamplifying circuit for receiving the audio signal and for receiving electrical energy from a power supply having a first rail at a positive potential and a second rail at a negative potential to produce a preamplified output signal;

a first output driver circuit comprising a voltage gain limited current amplifier coupled to the first rail and to a first output terminal of said input pre-amplifying circuit, the first output driver capable of producing a peak output voltage that is equal to the first rail minus one transistor saturation voltage; and a second output driver circuit comprising a voltage gain limited current amplifier coupled to the second rail and to a second output terminal of said input pre-amplifying circuit, the second output driver capable of producing a peak output voltage that is equal to the second rail plus one transistor saturation voltage;

wherein said input preamplifying circuit is operable to supply said preamplified output signal to one of said output driver circuits when the input signal current exceeds a current threshold and to the other of said output driver circuits when the input signal current is below said current threshold.

2. The apparatus of claim 1, wherein the voltage gain limited current amplifier of said first output driver circuit has a PNP output configuration and the voltage gain limited current amplifier of said second output driver circuit has an NPN output configuration.

3. The apparatus of claim 1, wherein said input preamplifier circuit comprises:

a current amplifier;

a bias network;

a current source for supplying a constant current to said bias network; and a differential amplifier responsive to the current level of said input signal to supply current to said current amplifier such that when said input signal current is less than the output current of said current source, excess current flows via said first output terminal into said first output driver circuit and when said input signal current is greater than the output current of said current source, a difference current flows via said second output terminal into said second output driver circuit.

4. The apparatus of claim 1, wherein each of said voltage gain limitation current amplifiers comprises a first transistor referenced to a voltage midway between respective voltages of said positive and negative rails.

5. The apparatus of claim 1, wherein each of said voltage gain limited current amplifiers further comprises at least one current amplifying drive transistor connected to a corresponding power supply rail.

6. The apparatus of claim 1, wherein each of said voltage gain limited current amplifiers further comprises a negative feedback circuit for limiting voltage gain without limiting the current gain of the first output driver circuit and the second output driver circuit.

* * * * *